(12) United States Patent
Urabe et al.

(10) Patent No.: US 6,971,938 B2
(45) Date of Patent: Dec. 6, 2005

(54) DISPLAY AND METHOD OF MANUFACTURING THE SAME

(75) Inventors: Tetsuo Urabe, Kanagawa (JP); Jiro Yamada, Kanagawa (JP); Tatsuya Sasaoka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/760,892

(22) Filed: Jan. 20, 2004

(65) Prior Publication Data

US 2004/0147200 A1 Jul. 29, 2004

Related U.S. Application Data

(62) Division of application No. 10/299,652, filed on Nov. 19, 2002.

(30) Foreign Application Priority Data

| Dec. 6, 2001 | (JP) | ............................ P2001-372949 |
| Oct. 21, 2002 | (JP) | ............................ P2002-305463 |

(51) Int. Cl.$^7$ ............................ H05B 33/04; H01J 5/16
(52) U.S. Cl. ............................ 445/24; 445/25; 427/64; 313/112; 313/506
(58) Field of Search ............................ 313/498–512, 313/110–112, 116–117; 445/24, 25; 428/690, 428/917; 427/64, 66

(56) References Cited

U.S. PATENT DOCUMENTS

| 5,239,228 A | * | 8/1993 | Taniguchi et al. | .......... 313/512 |
| 5,589,732 A | * | 12/1996 | Okibayashi et al. | ......... 313/506 |
| 5,844,255 A | * | 12/1998 | Suzuki et al. | .................. 257/59 |
| 6,072,450 A | * | 6/2000 | Yamada et al. | ................. 345/76 |
| 6,641,933 B1 | * | 11/2003 | Yamazaki et al. | ........... 428/690 |
| 6,646,692 B2 | * | 11/2003 | Yamazaki et al. | ............. 349/47 |
| 6,660,332 B2 | * | 12/2003 | Kawase et al. | .............. 427/266 |
| 2002/0167268 A1 | * | 11/2002 | Aruga et al. | .................. 313/500 |

FOREIGN PATENT DOCUMENTS

| EP | 1 085 576 A2 | 3/2001 | |
| EP | 1 109 224 A2 | 6/2001 | |
| JP | 02-287303 | 11/1990 | |
| JP | 08095024 A | * 4/1996 | ......... G02F 1/1335 |
| JP | 09092466 A | 4/1997 | |
| JP | 10-062768 | 3/1998 | |
| JP | 2000-029014 | 1/2000 | |
| JP | 2000-089215 | 3/2000 | |
| JP | 2001-181821 | 7/2001 | |
| JP | 20011267070 A | 9/2001 | |
| JP | 2001230072 A | 12/2001 | |

* cited by examiner

*Primary Examiner*—Karabi Guharay
*Assistant Examiner*—German Colón
(74) *Attorney, Agent, or Firm*—Robert J. Depke; Trexler, Bushnell, Giangiorgi, Blackstone & Marr (57) ABSTRACT

The invention provides a display of a type of getting light out of a second electrode side, capable of increasing contrast by suppressing external light reflection, simplifying a manufacturing process, and reducing cost, and a method of manufacturing the same. A substrate for driving is provided with organic electroluminescence (EL) devices for getting light out of a cathode side. A red filter, a green filter, and a blue filter are formed on a substrate for sealing by printing so as to face the organic EL devices. By overlapping at least two filters out of the red, green, and blue filters by printing, a black matrix is formed so as to face the boundary region of the organic EL devices, so that external light reflection by a wiring electrode between the devices is suppressed.

9 Claims, 11 Drawing Sheets

DISPLAY AND METHOD OF MANUFACTURING THE SAME

The present application is a divisional of U.S. application Ser. No. 10/299,652, filed Nov. 19, 2002, which claims priority to Japanese Patent Application No. JP2001-372949, filed Dec. 6, 2001, and Japanese Patent Application No. JP2002-305463, filed Oct. 21, 2002. The subject matter of U.S. application Ser. No. 10/299,652 is incorporated herein by reference.

BACKGROUND OF THE INVENTION

1. Field of the Invention

The present invention relates to a display having a plurality of organic electroluminescence (EL) devices in which a first electrode, at least one organic layer including a luminescent layer, and a second electrode are sequentially stacked, and getting light generated in the luminescent layer out of the second electrode side, and a method of manufacturing the same.

2. Description of the Related Art

Conventionally, a display using a self-emitting device such as a light emitting diode (LED), a laser diode (LD), or an organic electroluminescence device has been being developed. In the display of this kind, generally, a screen (display panel) is constructed by disposing a plurality of self-emitting devices in a matrix and each of the devices is selectively allowed to emit light in accordance with a picture signal, thereby displaying an image.

A display using the self-emitting devices has advantages such that a backlight required in a display of a non self-emitting type such as a liquid crystal display (LCD) is unnecessary. Particularly, in recent years, attention is paid to a display using organic EL devices (organic EL display) for the reasons such as wide angle of visibility, high visibility, and high speed of response of the devices.

An EL device has, for example, a structure in which a first electrode, organic layers including a luminescent layer, and a second electrode are sequentially stacked on a substrate for driving. In such an organic EL device, depending on the type of a display, light generated in the luminescent layer may emit from the substrate for driving or the second electrode side.

A display using such organic EL devices has a problem such that external light reflection by the organic EL devices and a wiring electrode between the devices is large and the contrast of the display deteriorates. In order to deal with the problem, a method of preventing the external light reflection by disposing a color filter or a black matrix has been proposed. For example, as a display of a type in which light is emitted from the second electrode side, the applicant herein has proposed a display in which an absorption filter of G (green) is disposed on the light output side of each of pixels of R (red) and B (blue) or on the external light incident side (Japanese Patent Application No. 2001-181821). In the proposal, considering that the naked eye has high sensitivity to light in the range of wavelength of G, the absorption filter of G is disposed for each of pixels of R and B to absorb the G component of incident external light and transmit light of R and B, thereby realizing dramatic improvement in contrast without deteriorating the brightness of an inherent luminescent color.

The configuration of using the color filter as in the proposal mainly aims at reducing external light reflection by the organic EL device itself. On the other hand, to suppress external light reflection by wiring electrodes and the like provided around pixels, a black matrix is used. Conventionally, as a black matrix of an organic EL display, in a manner similar to a liquid crystal display, for example, a thin film filter obtained by laminating thin films made of chrome (Cr) and chromium oxide and patterning the resultant by lithography technique and etching or a black resin film obtained by exposing a photosensitive resin with light and patterning the resin is used.

However, the role of the black matrix in an organic EL display and that in a liquid crystal display are quite different from each other, and required shape precision and optical density of an organic EL display and those of a liquid crystal display are also largely different from each other. Specifically, in a liquid crystal display, the black matrix has functions of defining the aperture ratio of pixels and shielding a backlight, so that high shape precision is required and optical density of 3 is necessary. In contrast, since no backlight is provided for an organic EL display, the optical density of 2 of the black matrix is sufficient, and high precision of the shape and position is not so required. The aperture ratio of pixels is defined by an insulating film made of silicon dioxide ($SiO_2$) or the like for electrically insulating first and second electrodes from each other, and has no relation with the black matrix. Therefore, the main object of disposing a black matrix in an organic EL display is to prevent external light reflection by a wiring electrode provided between devices. Forming a black matrix equivalent to that in a liquid crystal display in an organic EL display causes unnecessary increase in cost.

Requirements for a color filter in a liquid crystal display and those in an organic EL display are also different from each other. In a liquid crystal display, high-precision alignment is required so that backlight does not leak from a gap between color filters, and the surface of the color filter is preferably flat to sandwich liquid crystal. The cheapest method of forming a color filter is printing. In the printing, however, the edges of a pattern tend to be rounded and there is the possibility the aperture ratio decreases or varies in a liquid crystal display. For such reasons, the lithography technique is more widely used than printing for a liquid crystal display. However, in an organic EL display, the necessity of performing such a high-precision color filter fabricating process is low. Further, the material itself of a color filter is expensive and its cost makes up a considerable part of a liquid crystal display. In order to commercialize an organic EL display in full gear, it is indispensable to reduce the cost of the color filter and fabrication of the color filter.

Various attempts have been being made to replace the black matrix with a multilayer color filter of two or more colors in order to reduce cost. Reported examples include a technique of stacking color filters of single color or two or more colors in a frame portion of a substrate, and using the resultant as a shield layer (Japanese Patent Laid-Open Nos. 10-62768 and 2000-29014) and a technique of providing a multilayer color filter part between picture elements so as to also serve as a part of a black matrix or a partition for making liquid crystal molecules orient in an axially symmetrical fashion (Japanese Patent Laid-Open No. 2000-89215).

Another example is a multilayer color filter which can be used for not only a liquid crystal display but also various displays, color sensors, and the like, in which two layers of a resin of the same color are stacked in a pixel portion and resins of different two colors are stacked in a light shielding portion surrounding the pixel portion (Japanese Patent Laid-Open No. 2-287303). However, it has been pointed out that the configuration has a narrow alignment margin and it is difficult to apply the invention at least to a liquid crystal display (Japanese Patent Laid-Open Nos. 2000-29014 and 2000-89215). Since two layers of resin of the same color are stacked in the pixel portion, patterning by lithography has to be performed total six times in order to form two pattern layers of color filters of three colors, and the like, the manufacturing processes are too complicated from the viewpoints of performance and characteristics required for the color filters of an organic EL display, and an effect at reducing the cost which is the most important subject right now is poor.

SUMMARY OF THE INVENTION

The invention has been achieved in consideration of the above problems and its object is to provide a display of a type that emits light from a second electrode side, capable of increasing contrast by suppressing external light reflection by a wiring electrode between organic EL devices and realizing a simplified manufacturing process and reduction in cost, and a method of manufacturing the same.

A display according to the invention comprises: a driving panel having, on a substrate for driving, a plurality of organic EL devices in which a first electrode, one or more organic layers including a luminescent layer, and a second electrode are sequentially stacked, and for getting light generated in the luminescent layer out of the side of the second electrode; and a sealing panel having a configuration in which a red filter, a green filter, and a blue filter each formed by printing so as to face the plurality of organic EL devices, and a black matrix obtained by stacking at least two filters out of the red filter, the green filter, and the blue filter by printing so as to face a boundary region of the plurality of organic EL devices are disposed on a substrate for sealing, and being disposed so as to face the second electrode side of the driving panel.

A method of manufacturing a display according to the invention comprises the steps of: forming a driving panel having, on a substrate for driving, a plurality of organic EL devices in which a first electrode, one or more organic layers including a luminescent layer, and a second electrode are sequentially stacked, and for getting light generated in the luminescent layer out of the side of the second electrode; forming a sealing panel by forming a red filter, a green filter, and a blue filter, and a black matrix which is obtained by stacking at least two filters out of the red filter, the green filter, and the blue filter on a substrate for sealing by printing; forming an adhesive layer so as to cover the organic EL devices; and disposing the sealing panel so as to face the second electrode side of the driving panel and curing the adhesive layer, thereby adhering the sealing panel and the driving panel to each other.

In the display and the method of manufacturing the display according to the invention, the red, green, and blue filters are formed by printing and at least two filters out of the red, green, and blue filters are overlapped with each other by printing, thereby forming the black matrix so as to face the boundary region of the organic EL devices. Therefore, by the simple manufacturing process, the color filters and the black matrix having performance necessary and sufficient for the organic EL display can be formed at low cost.

Other and further objects, features and advantages of the invention will appear more fully from the following description.

DETAILED DESCRIPTION OF THE PREFERRED EMBODIMENTS

Embodiments of the invention will be described in detail hereinbelow with reference to the drawings.

[First Embodiment]

Figure 1:
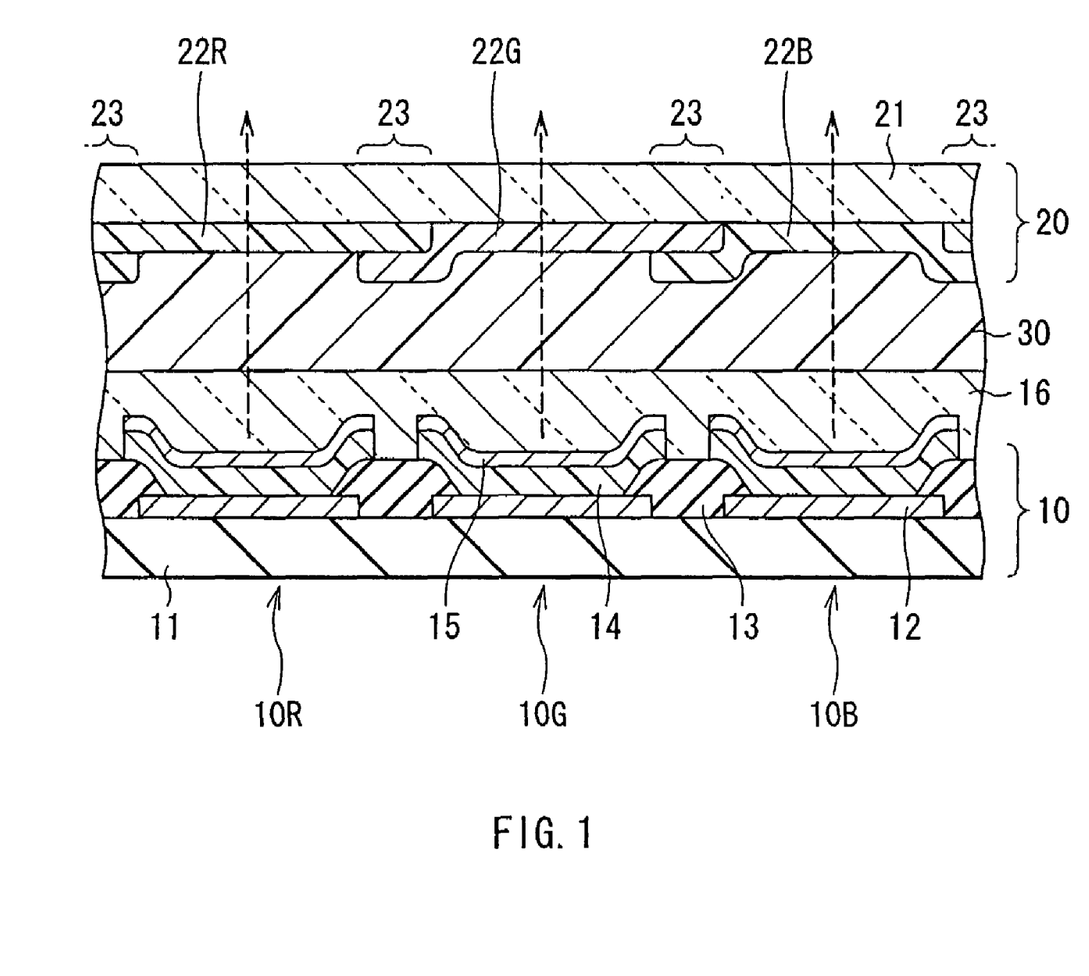
FIG. 1 is a cross section showing the configuration of a display according to a first embodiment of the invention.

FIG. 1 shows a sectional structure of a display according to a first embodiment of the invention. The display is used as an organic EL color display of a very thin type. In the display, for example, a driving panel 10 and a sealing panel 20 are disposed so as to face each other and their whole surfaces are adhered to each other with an adhesive layer 30 in between. In the driving panel 10, for example, on a substrate 11 for driving made of an insulating material such as glass, an organic EL device 10R emitting red light, an organic EL device 10G emitting green light, and an organic EL device 10B emitting blue light are provided in order in a matrix as a whole.

Each of the organic EL devices 10R, 10G, and 10B has a structure in which, for example, an anode 12 as a first electrode, an insulating layer 13, an organic layer 14, and a cathode 15 as a second electrode are stacked in this order on the substrate 11 for driving. The organic EL devices 10R, 10G, and 10G are covered with a protective layer (passivation) 16 made of, for example, silicon nitride (SiN). The protective layer 16 is used to prevent invasion of moisture and oxygen into the organic EL devices 10R, 10G, and 10B.

The anode 12 has, for example, a thickness in the stack direction (hereinbelow, simply called thickness) of about 200 nm and is made of a metal such as platinum (Pt), gold (Au), silver (Ag), chrome (Cr), or tungsten (W) or an alloy of any of the metals.

The insulating layer 13 is used to assure insulation between the anode 12 and the cathode 15 and to make the shape of the luminescent region in the organic EL devices 10R, 10G, and 10B an accurately desired shape. The insulating layer 13 has, for example, a thickness of about 600 nm, is made of an insulating material such as silicon dioxide ($SiO_2$) and has an aperture 13A (refer to FIGS. 2 and 3) corresponding to the luminescent region.

Figure 2:
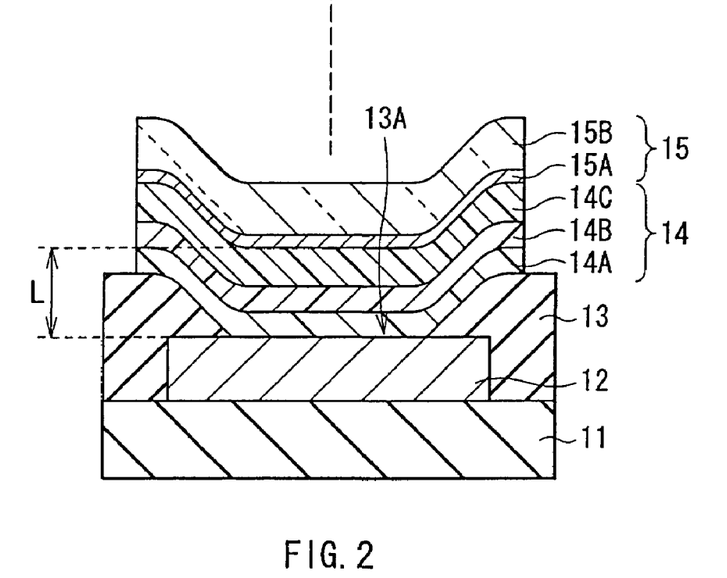
FIG. 2 is an enlarged cross section showing the configuration of an organic EL device in the display illustrated in FIG. 1.

The configuration of the organic layer 14 varies in the organic EL devices 10R, 10G, and 10B. FIG. 2 enlargedly shows the configuration of the organic layer 14 in the organic EL devices 10R and 10G. In each of the organic EL devices 10R and 10G, the organic layer 14 has a structure in which a hole injection layer 14A, a hole transport layer 14B, and a luminescent layer 14C each made of an organic material are stacked in this order on the anode 12. The hole injection layer 14A and the hole transport layer 14B are used to increase efficiency of hole injection to the luminescent layer 14C. The luminescent layer 14C generates light by passage of current in a region corresponding to the aperture 13A of the insulating layer 13.

In the organic EL device 10R, the hole injection layer 14A has, for example, a thickness of about 30 nm and is made of 4,4',44"-tris(3-methylpheynylphenylamino)triphenylamine (MTDATA). The hole transport layer 14B has, for example, a thickness of about 30 nm and is made of bis[(N-naphthyl)-N-phenyl]benzidine (α-NPD). The luminescent layer 14C has, for example, a thickness of about 40 nm and is made of a material obtained by mixing 8-quinolinol aluminum complex (Alq) with 2% by volume of 4-dicyanomethylene-6-(p-dimethylaminostyryl)-2-methyl-4H-pyran (DCM).

In the organic EL device 10G, each of the hole injection layer 14A and the hole transport layer 14B is made of a material similar to that of the organic EL device 10R. The thickness of the hole injection layer 14A is, for example, about 30 nm. The thickness of the hole transport layer 14B is, for example, about 20 nm. The luminescent layer 14C has, for example, a thickness of about 50 nm and is made of 8-quinolynol aluminum complex (alq).

Figure 3:
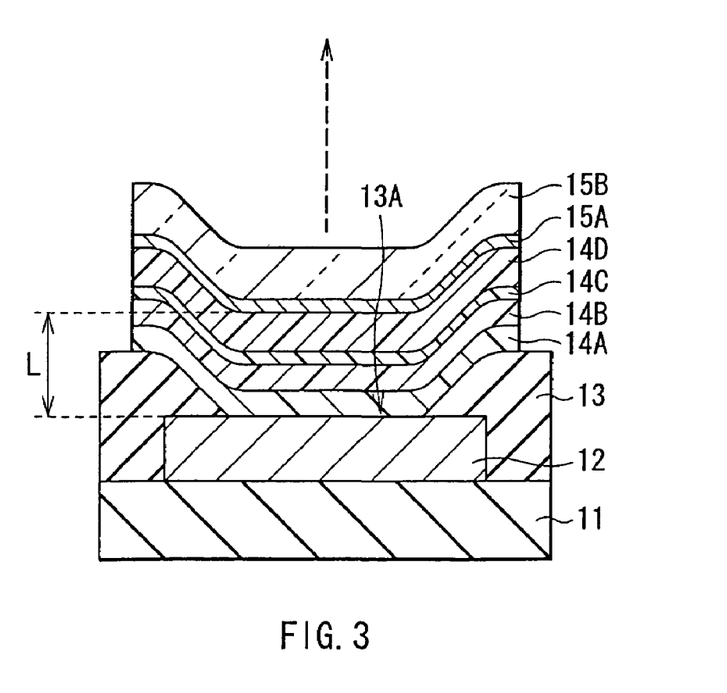
FIG. 3 is an enlarged cross section showing the configuration of an organic EL device in the display illustrated in FIG. 1.

FIG. 3 is an enlarged view of the configuration of the organic layer 14 in the organic EL device 10B. In the organic EL device 10B, the organic layer 14 has a structure in which the hole injection layer 14A, the hole transport layer 14B, the luminescent layer 14C, and an electron transport layer 14D each made of an organic material are stacked in this order on the anode 12. The electron transport layer 14D is used to increase efficiency of implanting electrons into the luminescent layer 14C.

In the organic EL device 10B, the hole injection layer 14A and the hole transport layer 14B are made of materials similar to those of the organic EL devices 10R and 10G, respectively. The hole transport layer 14A has, for example, a thickness of about 30 nm and the hole transport layer 14B has, for example, a thickness of about 30 nm. The luminescent layer 14C has, for example, a thickness of about 15 nm and is made of. bathocuproin (BCP). The electron transport layer 14D has, for example, a thickness of about 30 nm and is made of Alq.

The cathode 15 has a structure in which, as shown in FIGS. 2 and 3, a semi-transparent electrode 15A half-transmitting light generated in the luminescent layer 14C and a transparent electrode 15B transmitting light generated in the luminescent layer 14C are stacked in this order on the organic layer 14. With the configuration, in the driving panel 10, as shown by the arrow of a broken line in FIGS. 1 to 3, light generated in the luminescent layer 14C goes out from the cathode 15 side.

The semi-transparent electrode 15A has, for example, a thickness of about 10 nm and is made of an alloy (MgAg alloy) of magnesium (Mg) and silver (Ag). The semi-transparent electrode 15A is used to make light generated in the luminescent layer 14C reflected between the semi-transparent electrode 15A and the anode 12. That is, the semi-transparent electrode 15A and the anode 12 construct a resonance part of a resonator for resonating light generating the luminescent layer 14C. It is preferable to construct the resonator in such a manner for the following reason. The light generated in the luminescent layer 14C causes multiple interference and the resonator acts as a kind of a narrow-band filter, thereby decreasing the half band width of spectrum of light to be emitted and improving color purity. It is also preferable for the reason that the external light incident from the sealing panel 20 can be also attenuated by the multiple interference, and the reflectance of external light in the organic EL devices 10R, 10G, and 10B can be reduced to be extremely low by combination with a red filter 22R, a green filter 22G, and a blue filter 22B (refer to FIG. 1) which will be described hereinlater.

Consequently, it is preferable to make the peak wavelength of the narrow-band filter and the peak wavelength of the spectrum of light to be emitted coincide with each other. Specifically, when a phase shift of reflection light reflected by the anode 12 and the semi-transparent electrode 15A is Φ(rad), optical distance between the anode 12 and the semi-transparent electrode 15A is L, and the peak wavelength of the spectrum of light to be emitted from the cathode 15 side is λ, preferably, the optical distance L satisfies Equation 1. In practice, it is preferably to select the optical distance L so as to become the positive minimum value satisfying Equation 1. In Equation 1, it is sufficient to use a unit common to L and λ. As an example, nanometer (nm) is used as the unit.

$$2L/\lambda + \Phi/2\pi = q \text{ ($q$ is an integer)} \quad \text{Equation 1}$$

The transparent electrode 15B is used to reduce electrical resistance of the semi-transparent electrode 15A and is made of a conductive material having sufficient transmittance with respect to light generated in the luminescent layer 14C. A preferable example of the material of the transparent electrode 15B is a compound containing indium, zinc (Zn), and oxygen for the reason that even when a film is formed of the compound at a room temperature, excellent conductivity can be obtained. Preferably, the thickness of the transparent electrode 15B is, for example, about 200 nm.

As shown in FIG. 1, the sealing panel 20 is positioned on the side of the cathode 15 of the driving panel 10 and has a substrate 21 for sealing the organic EL devices 10R, 10G, and 10B together with the adhesive layer 30. The substrate 21 for sealing is made of a material such as glass transparent to light generated by the organic EL devices 10R, 10G, and 10B. On the substrate 21 for sealing, for example, as color filters, the red filter 22R, green filter 22G and blue filter 22B, and a black matrix 23 are provided, through which light generated by the organic EL devices 10R, 10G, and 10B goes out and which absorb external light reflected by the organic EL devices 10R, 10G, and 10B and wiring electrodes and the like (not shown) provided between the devices, thereby improving the contrast.

The red, green, and blue filters 22R, 22G, and 22B and the black matrix 23 may be provided on any of the sides of the substrate 21 for sealing but preferably provided on the side of the driving panel 10 for the reason that the red, green, and blue filters 22R, 22G, and 22B and the black matrix 23 are not exposed to the surface and can be protected by the adhesive layer 30. The red, green, and blue filters 22R, 22G, and 22B are disposed in order corresponding to the organic EL devices 10R, 10G, and 10B, respectively.

Figure 4:
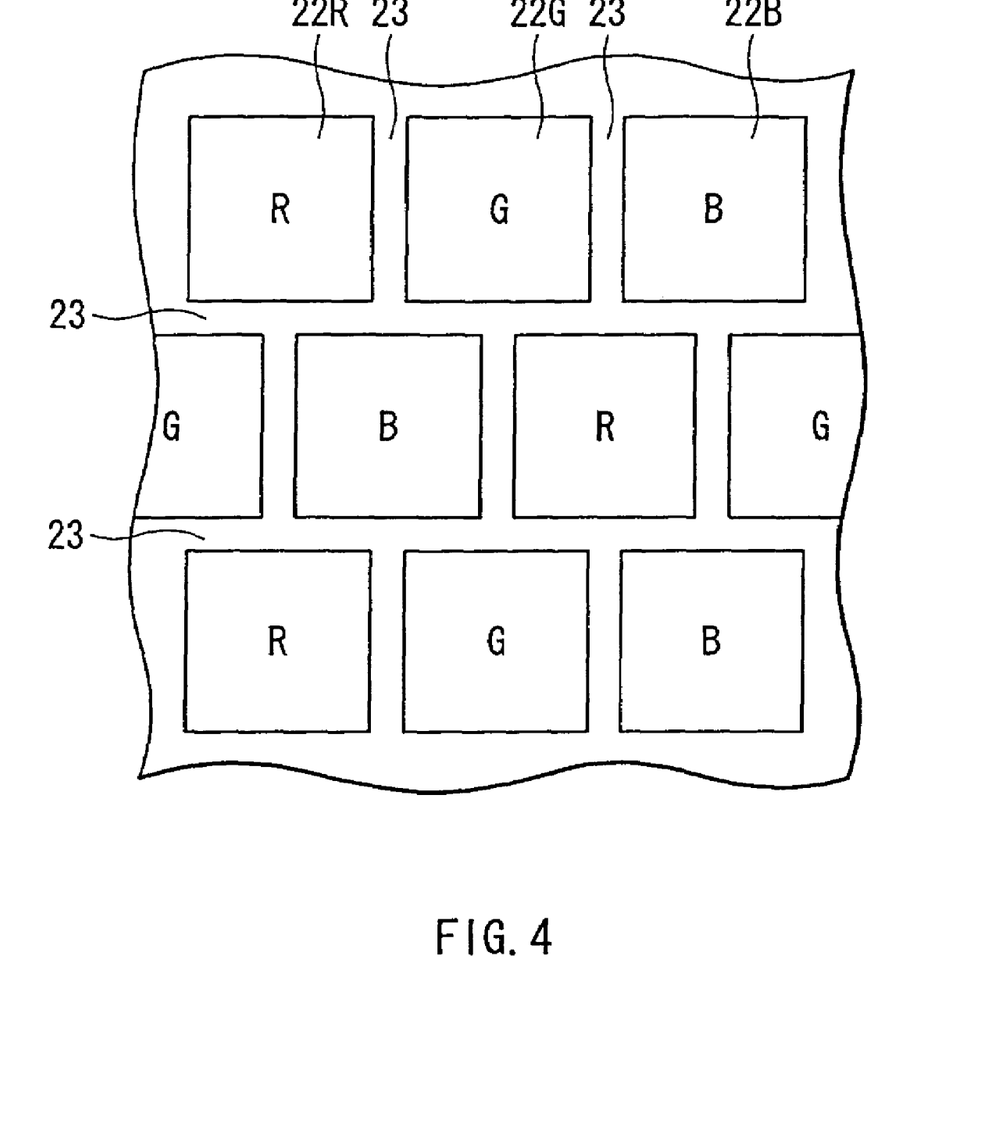
FIG. 4 is a plan view seen from a driving panel side showing the configuration of red, green, and blue filters in the display illustrated in FIG. 1.

FIG. 4 is a plan view showing the configuration of the red filter 22R, green filter 22G, and blue filter 22B seen from the side of the driving panel 10. In FIG. 4, to facilitate identification of the red, green, and blue filters 22R, 22G, and 22B, the red, green, and blue filters 22R, 22G, and 22B are marked with characters of "R", "G", and "B", respectively.

The red, green, and blue filters 22R, 22G, and 22B are formed by printing in positions facing the organic EL devices 10R, 10G, and 10B, respectively. The red, green, and blue filters 22R, 22G, and 22B each having a rectangular shape are disposed in a delta shape. Each of the red, green, and blue filters 22R, 22G, and 22B is made of a rein mixed with a pigment. By selecting a pigment, the light transmittance in the wavelength range in red, green or blue as a target color is adjusted to be high, and the light transmittance in the other wavelength is adjusted to be low.

Figure 5A:
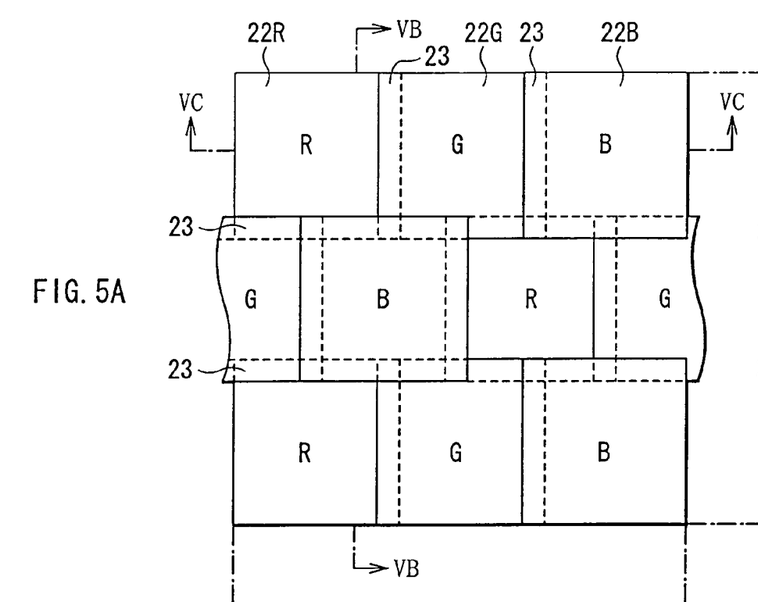
FIGS. 5A to 5C are a plan view and cross sections showing a state where the red, green, and blue filters illustrated in FIG. 4 are overlapped with each other.
Figure 5B:
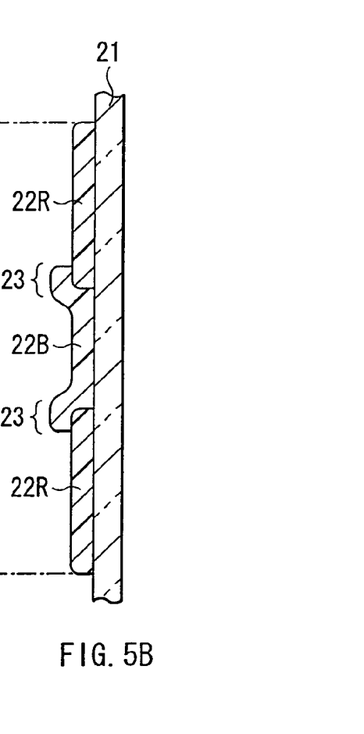
Figure 5C:
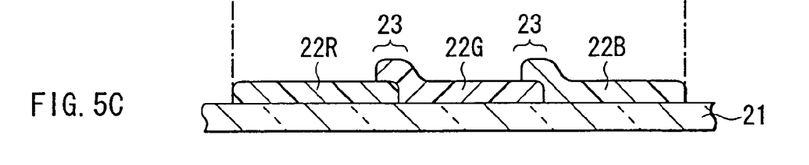

Along the borders of the red, green, and blue filters 22R, 22G, and 22B, the black matrix 23 is provided. The black matrix 23 has a structure that, as shown in FIGS. 1 and 5, at least two filers of the red, green, and blue filters 22R, 22G, and 22B are stacked by printing, and is formed in the position facing the border region of the organic EL devices 10R, 10G, and 10B.

The adhesive layer 30 covers the whole face of the side on which the organic EL devices 10R, 10G, and 10B are provided of the driving panel 10 as shown in FIG. 1, thereby more effectively preventing corrosion and breakage of the organic EL devices 10R, 10G, and 10B. The adhesive layer 30 does not have to be always provided for the whole surface of the driving panel 10 but may be provided so as to cover at least the organic EL devices 10R, 10G, and 10B. The adhesive layer 30 is made of, for example, an ultraviolet curing resin or a thermosetting resin.

The display can be manufactured as follows, for example.

Figure 6A:
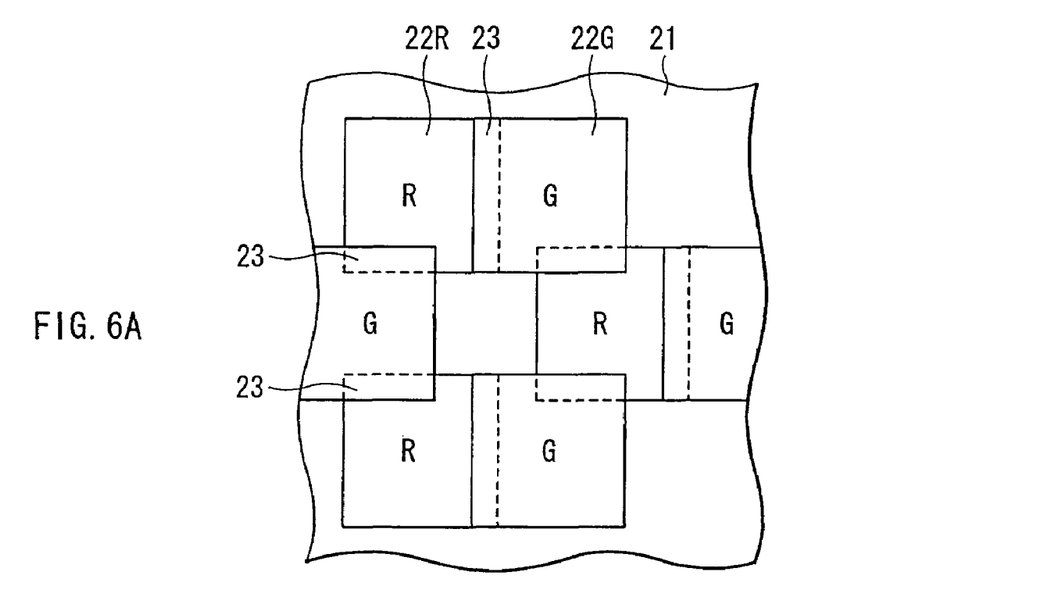
FIGS. 6A and 6B are plan views showing a method of manufacturing the display illustrated in FIG. 1 in order of processes.

FIGS. 6A and 6B to FIGS. 8A and 8B show the method of manufacturing the display in order of processes. First, as shown in FIG. 6A, for example, the red filter 22R made of the above-described material is formed on the substrate 21 for sealing made of the above-described material by printing and, further, the green filter 22G is formed by printing. At this time, by overlapping the peripheral portion of the red filter 22R and that of the green filter 22G, the black matrix 23 is formed. As the printing method, for example, gravure process which is conventionally performed can be applied. Specifically, first, the material of the red filter 22R or green filter 22G is uniformly applied on a not-shown roll, further, the roll is rolled on a not-shown plate on which the pattern of the red filter 22R or green filter 22G is formed to transfer the material of the red filter 22R or green filter 22G onto the plate. Finally, the material of the red filter 22R or green filter 22G is transferred to the substrate 21 for sealing.

Figure 6B:
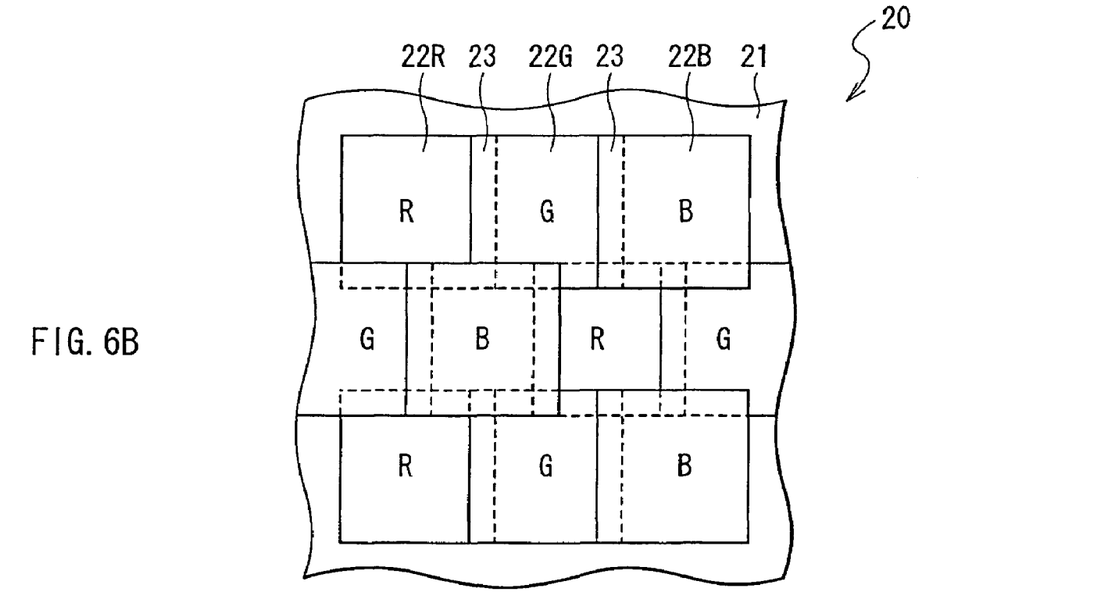

Subsequently, as shown in FIG. 6B, the blue filter 22B is formed on the substrate 21 for sealing by printing. At this time, by making the peripheral portion of the blue filter 22B and the peripheral portions of the red and green filters 22R and 22G overlapped with each other, the black matrix 23 as shown in FIG. 4 is formed. In such a manner, the sealing panel 20 is fabricated.

Figure 7A:
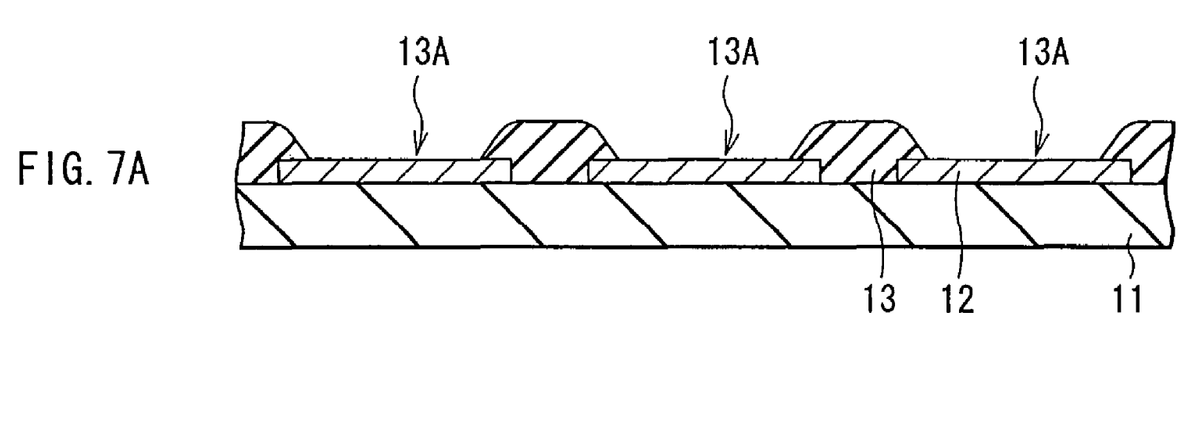
FIGS. 7A and 7B are cross sections showing a process following FIGS. 6A and 6B.

As shown in FIG. 7A, for example, on the substrate 11 for driving made of the above-described material, a plurality of anodes 12 made of the above-described material are formed by, for example, DC sputtering. Subsequently, on the anode 12, the insulating layer 13 is formed with the above-described thickness by, for example, CVD (Chemical Vapor Deposition). A portion corresponding to the luminescent region is selectively removed by using, for example, lithography technique to thereby form the aperture 13A.

Figure 7B:
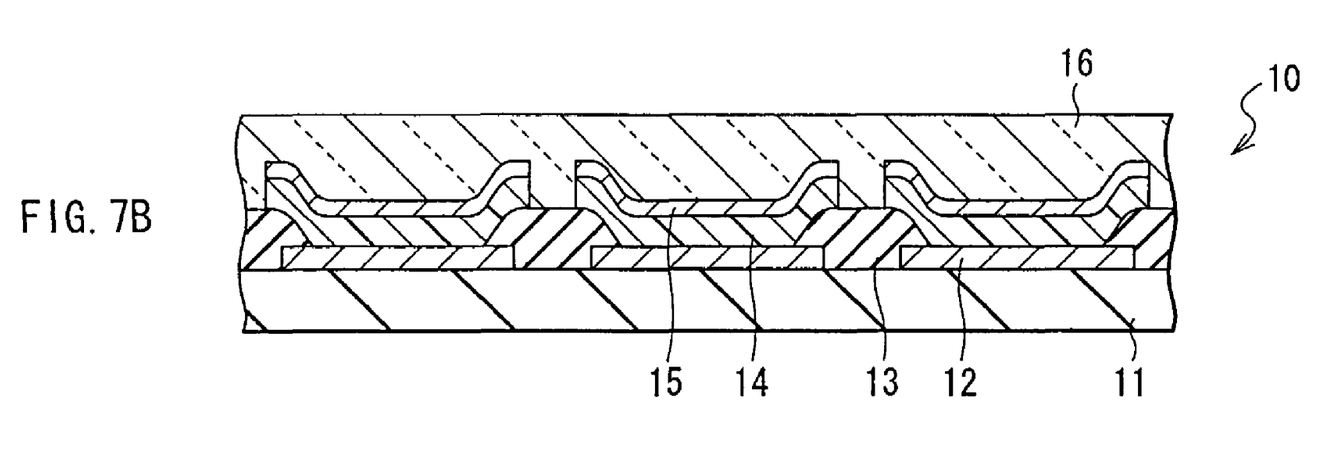

Subsequently, as shown in FIG. 7B, by using a not-shown area mask, the hole injection layer 14A, hole transport layer 14B, luminescent layer 14C, and electron transport layer 14D each having the above-described thickness and made of the above-described material are sequentially formed corresponding to the aperture 13A of the insulting layer 13 by, for example, evaporation. At this time, the layers are formed for each of the organic EL devices 10R, 10G, and 10B while changing the area mask used according to each of the organic EL devices 10R, 10G, and 10B. Since it is difficult to deposit the layers with high precision only in the aperture 13A, the whole aperture 13A is covered and the layers can be deposited so as to be slightly overlapped with the periphery of the insulating layer 13. After forming the organic layer 14, by using a not-shown area mask, the semi-transparent electrode 15A having the above-described thickness and made of the above-described material is formed by, for example, evaporation. After that, on the semi-transparent electrode 15A, by using the same area mask as that used for the semi-transparent electrode 15A, the transparent electrode 15B is formed by, for example, DC sputtering. Finally, the organic EL devices 10R, 10G, and 10B are covered with the protective layer 16 made of, for example, the above-described material. In such a manner, the driving panel 10 is formed.

Figure 8A:
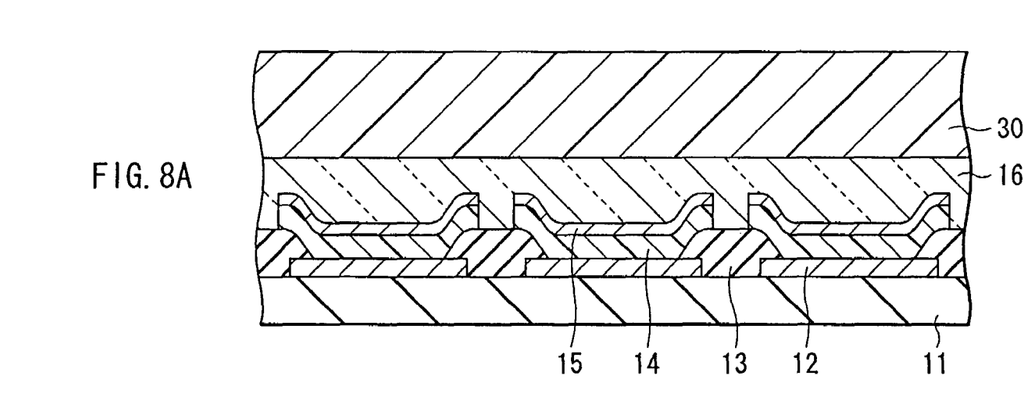
FIGS. 8A and 8B are cross sections showing a process following FIGS. 7A and 7B.

After forming the sealing panel 20 and the driving panel 10, as shown in FIG. 8A, the side on which the organic EL devices 10R, 10G, and 10B are formed of the substrate 11 for driving is coated with the adhesive layer 30 made of, for example, ultraviolet curing resin or thermosetting resin. The coating may be performed by, for example, injecting resin from a slit nozzle type dispenser, roll coating, screen printing, or the like.

Figure 8B:
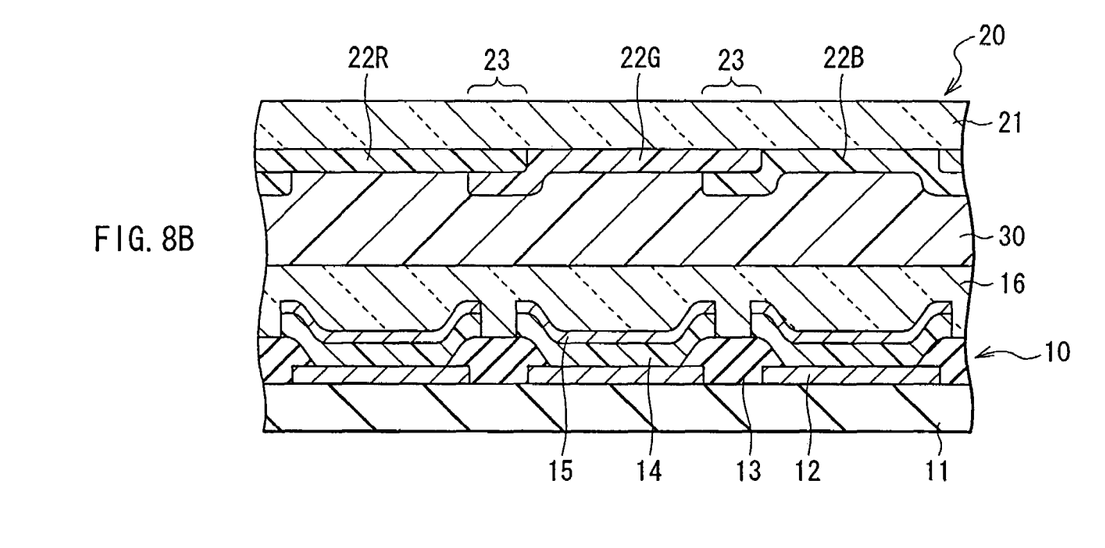

As shown in FIG. 8B, the driving panel 10 and the sealing panel 20 are adhered to each other with the adhesive layer 30 in between. It is preferable to dispose the side on which the red filter 22R, green filter 22G, blue filter 22B, and black matrix 23 are formed of the sealing panel 20 so as to face the driving panel 10. It is also preferable to prevent air bubbles and the like from entering the adhesive layer 30. Subsequently, by properly moving, for example, the sealing panel 20 before the adhesive layer 30 is cured, the relative positions of the sealing panel 20 and the driving panel 10 are aligned. That is, the organic EL devices 10R, 10G, and 10B are aligned with the red, green, and blue filters 22R, 22G, and 22B, respectively. At this time, the adhesive layer 30 is not cured yet, and the sealing panel 20 and the driving panel 10 can be moved relative to each other by about few hundreds $\mu$m. Finally, by irradiating the adhesive layer 30 with ultraviolet rays or heating the adhesive layer 30 to a predetermined temperature, the adhesive layer 30 is cured to thereby adhere the driving panel 10 and the sealing panel 20 to each other. By the above, the display shown in FIGS. 1 to 5 is completed.

In the display fabricated in such a manner, when a predetermined voltage is applied between the anode 12 and the cathode 15, current is passed to the luminescent layer 14C, and holes and electrons are recombined, thereby generating light on the interface on the luminescent layer 14C side. The light is multi-reflected between the anode 12 and the semi-transparent electrode 15A, passes through the cathode 15, adhesive layer 30, red, green, and blue filters 22R, 22G, and 22B, and substrate 21 for sealing, and goes out from the sealing panel 20 side. In the embodiment, the sealing panel 20 is provided with the red, green, and blue filters 22R, 22G, and 22B and the black matrix 23, so that external light incident from the sealing panel 20 is prevented from being reflected by the organic EL devices 10R, 10G, and 10B and the wiring electrodes positioned between the devices and emitted from the sealing panel 20. Thus, contrast is improved.

In the embodiment, the resonator having the resonance portion constructed by the semi-transparent electrode 15A and the anode 12 is constructed in each of the organic EL devices 10R, 10G, and 10B. Consequently, by multiple interference, the half band width of the spectrum of light to be emitted decreases, color purity is improved, external light attenuates, and the reflectance of the external light is reduced by the combination of the red, green, and blue filters 22R, 22G, and 22B. Thus, contrast can be further improved.

According to the embodiment as described above, the red, green, and blue filters 22R, 22G, and 22B are formed by printing on the substrate 21 for sealing, and the black matrix 23 is formed by overlapping at least two filters out of the red, green, and blue filters 22R, 22G, and 22B. Consequently, only by performing the printing process once for each of the red, green, and blue filters 22R, 22G, and 22B (total three times), the red, green, and blue filters 22R, 22G, and 22B can be formed and, simultaneously, the black matrix 23 can be also formed. The black matrix 23 can be therefore manufactured cheaply and easily. It is true that, as compared with the conventional thin film filter having the structure of a multilayer of chrome and chrome oxide or a resin film of black, the black matrix 23 has lower shape precision and lower optical density since at least two colors out of red, green, and blue are overlapped. However, in the organic EL display having no backlight and no liquid crystal, even the black matrix 23 which is, so to speak, pseudo black is sufficient to prevent external light reflection by the wiring electrode between the devices and to improve the contrast.

When each of the organic EL devices 10R, 10G, and 10B has the resonator including the resonance part constructed by the semi-transparent electrode 15A and the anode 12, by causing multiple interference with the light generated in the luminescent layer 14C and allowing the resonator to act as a kind of a narrow-band filter, the half band width of the spectrum of light to be emitted can be decreased, and color purity can be improved. Further, the external light incident from the sealing panel 20 can be also attenuated by the multiple interference, so that the reflectance of external light in the organic EL devices 10R, 10G, and 10B can be reduced to be extremely low by combination with the red, green, and blue filters 22R, 22G, and 22B. Thus, the contrast can be improved more.

[Second Embodiment]

Figure 9:
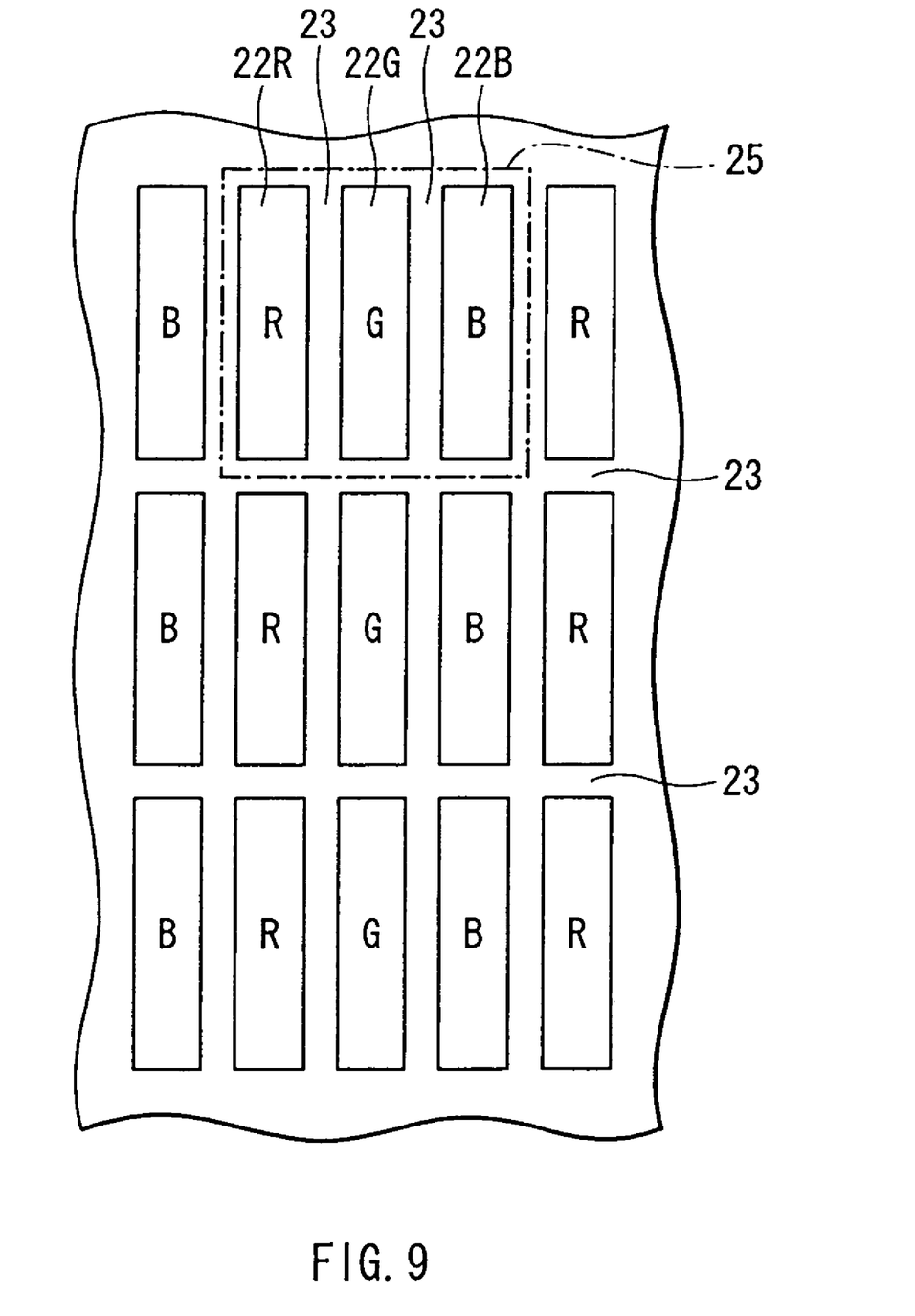
FIG. 9 is a plan view seen from the side of a driving panel showing the configuration of red, green, and blue filters in a display according to a second embodiment of the invention.

A display according to a second embodiment of the invention will now be described. The display is the same as that described with reference to FIGS. 1 to 3 in the first embodiment except that the red, green, and blue filters 22R, 22G and 22B are disposed in stripes as shown in FIG. 9. Therefore, the same reference numeral is designated to the same component and its detailed description will not be repeated.

In the display, the red, green, and blue filters 22R, 22G and 22B are formed in stripes by printing. The black matrix 23 is provided between the neighboring stripes of the different colors and is also provided at predetermined intervals in the stripes of each color. With the configuration, as shown by an alternate long and short dash line in FIG. 9, a pixel 25 is formed by the neighboring red, green, and blue filters 22R, 22G and 22B.

Figure 10A:
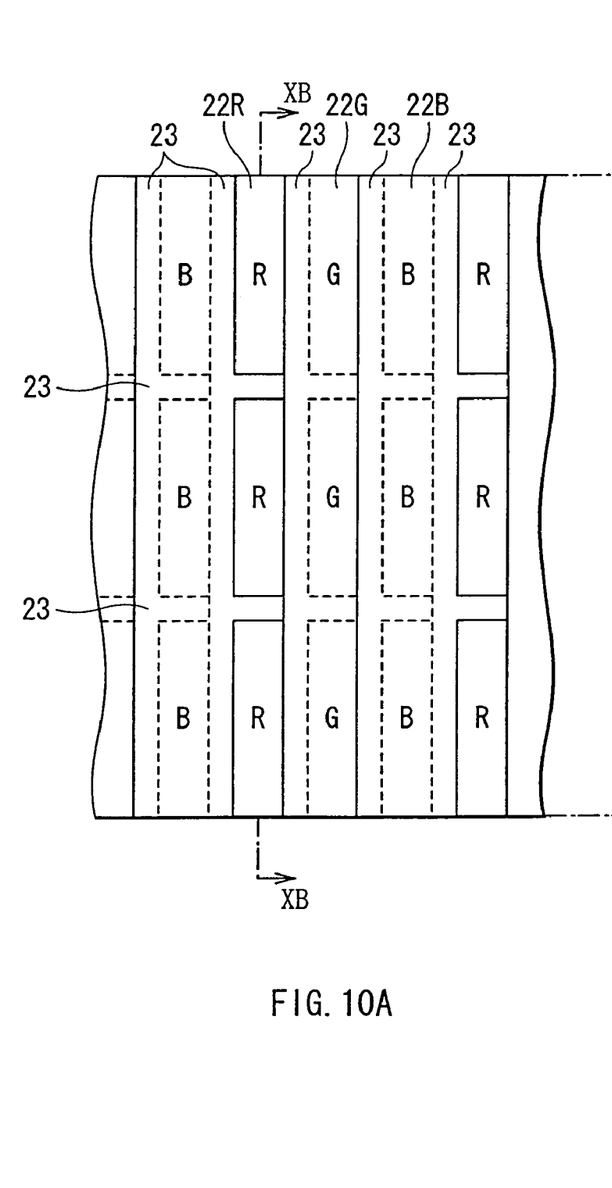
FIGS. 10A and 10B are a plan view and a cross section showing a state where the red, green, and blue filters illustrated in FIG. 9 are overlapped with each other.
Figure 10B:
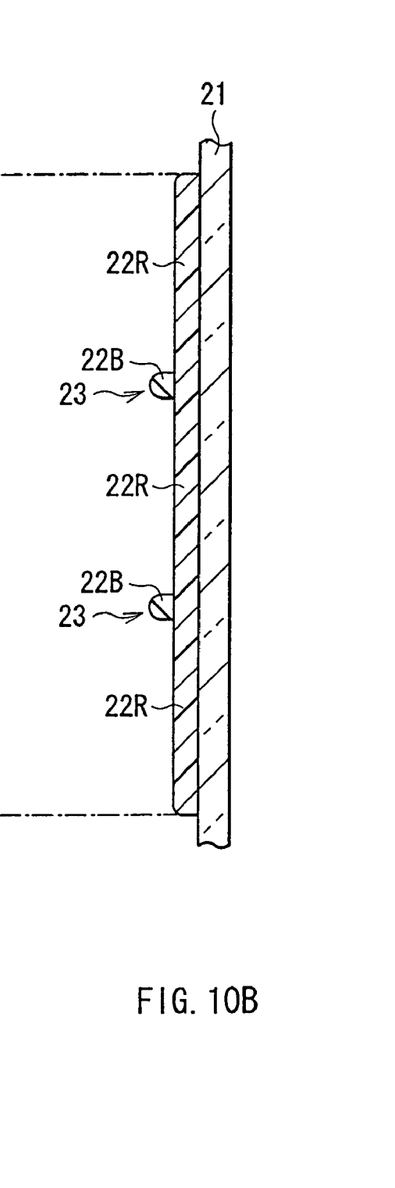

Concretely, as shown in the cross section of FIG. 10B, for example, the filter 22B of blue as a complementary color of red is overlaid on the red filter 22R, thereby forming the black matrix 23. Similarly, although not shown in the cross section, the filter 22R of red as a complementary color of green is overlaid on the green filter 22G, and the filter 22G of green containing yellow as a complementary color of blue is overlaid on the blue filter 22B.

Figure 11A:
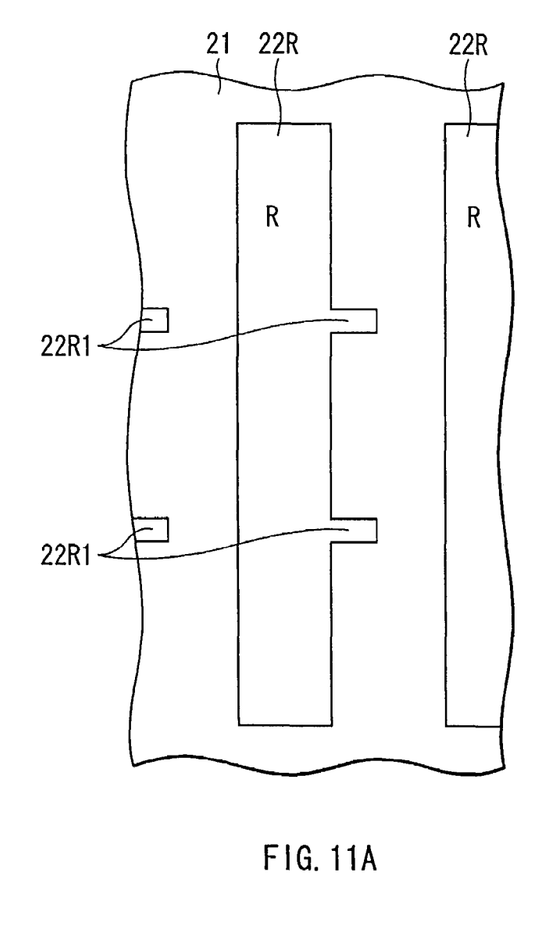
FIGS. 11A and 11B are plan views showing a method of manufacturing the red, green, and blue filters illustrated in FIGS. 10A and 10B in order of processes.
Figure 11B:
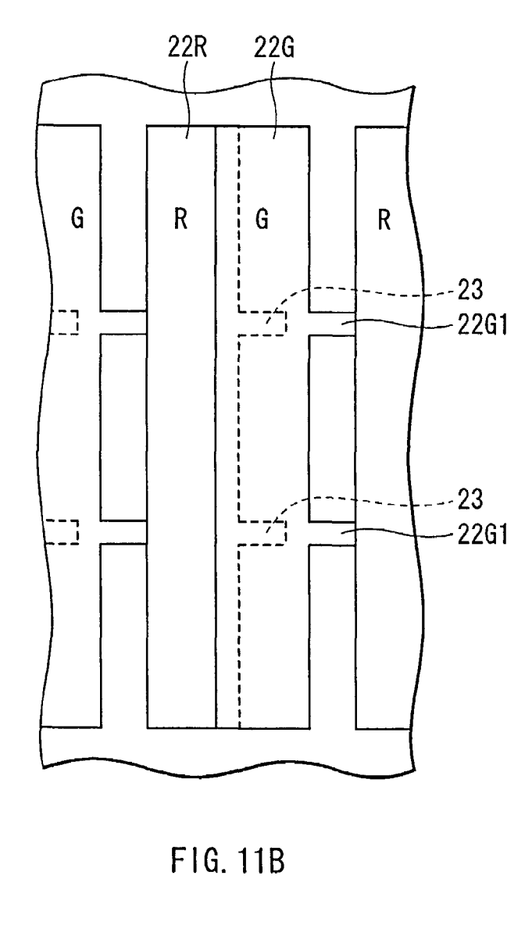

The display having the red filter 22R, green filter 22G, and blue filter 2218 as shown in FIG. 10 can be manufactured as shown in FIGS. 11A and 11B. Specifically, first, as shown in FIG. 11A, the red filter 22R is formed on the substrate 21 for sealing by printing. The pattern of the red filter 22R includes, for example, an elongated projected portion 22R1 which is overlaid on the neighboring green filter 22G to form the black matrix 23.

Subsequently, as shown in FIG. 11B, the green filter 22G is formed by printing, so that the projected portion 22R1 of the red filter 22R and the stripe of the green filter 22G are overlapped with each other, thereby forming the black matrix 23. In a manner similar to the red filter 22R, the green filter 22G also includes a projected portion 22G1 which is overlaid on the neighboring blue filter 22B to form the black matrix 23. Finally, as shown in FIG. 10A, the blue filter 22B is formed by printing. The blue filter 22B also includes a projected portion 22B1 which is overlaid on the red filter 22R to form the black matrix 23. In such a manner, the red, green, and blue filters 22R, 22G, and 22B are formed and, simultaneously, the black matrix 23 can be completed.

After forming the sealing panel 20, as described in the first embodiment, the driving panel 10 is formed, and the sealing panel 20 and the driving panel 10 are adhered to each other with the adhesive layer 30 in between.

According to the embodiment, even in the case where the red, green, and blue filters 22R, 22G, and 22B are disposed in stripes, by overlapping two filters out of the red, green, and blue filters 22R, 22G, and 22B, the black matrix 23 can be formed. In a manner similar to the first embodiment, the red, green, and blue filters 22R, 22G, and 22B are formed and, simultaneously, the black matrix 23 can be also formed only by the printing process of three times. Therefore, by the simple manufacturing process, the red, green, and blue filters 22R, 22G, and 22B, and black matrix 23 which are necessary for the organic EL display and have sufficient performance and characteristics for the organic EL display can be formed at low cost.

Since each of the projected portions 22R1, 22G1, and 22B1 has an elongated shape, it cannot be expected to obtain high shape precision by printing. However, the projected portions 22R1, 22G1, and 22B1 sufficiently function as the black matrix 23 for preventing external light reflection by the wiring electrode between the devices. Strict position alignment between the projected portions 22R1, 22G1, and 22B1 and the green, blue, and red filters 22G, 22B, and 22R neighboring to the projected portions 22R1, 22G1, and 22B1 is not required. Even if a gap or an overlapped portion is formed due to some deviations, it is not feared that an adverse influence is exerted to the external light reflection preventing function of the black matrix 23.

[Third Embodiment]

Figure 12:
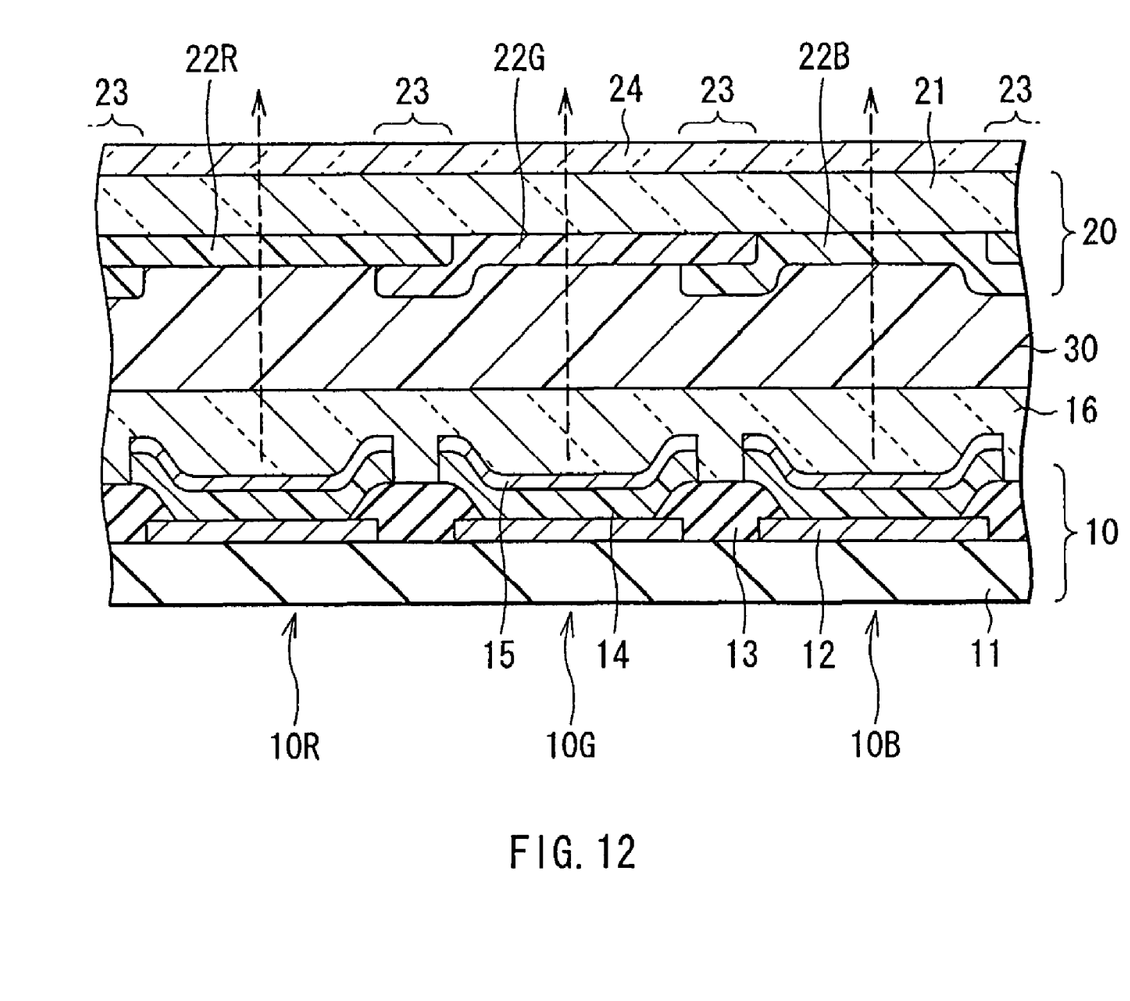
FIG. 12 is a cross section showing the configuration of a display according to a third embodiment of the invention.

FIG. 12 shows a display according to a third embodiment of the invention. The display is the same as that described in the first embodiment except that an antireflection film 24 is provided on the surface opposite to the driving panel 10 of the substrate 21 for sealing. The same component is designated by the same reference numeral and its detailed description will not be repeated.

The antireflection film 24 is used to prevent surface reflection of external light in the substrate 21 for sealing. In the case where the substrate 21 for sealing is made of, for example, glass, its surface reflectivity is about 4%. When external light reflection in the display is suppressed by the red, green, and blue filters 22R, 22G, and 22B, the black matrix 23, and the like, the surface reflection in the substrate 21 for sealing cannot be ignored.

The antireflection film 24 is preferably constructed by, for example, a thin film filter in which silicon oxide ($SiO_2$), titanium oxide ($TiO_2$) or niobium oxide ($Nb_2O_5$) are stacked. Alternately, the antireflection film 24 may be formed by adhering an AR (Anti Reflection) film on the surface of the substrate 21 for sealing.

As described above, according to the embodiment, in addition to the effects described in the first embodiment, the antireflection film 24 is provided for the substrate 21 for sealing. Consequently, the surface reflection of external light by the substrate 21 for sealing can be reduced, and the contrast can be further improved.

Although the invention has been described by the foregoing embodiments, the invention is not limited to the foregoing embodiments but can be variously modified. For example, although the configurations of the organic EL devices 10R, 10G, and 10B have been described concretely in the foregoing embodiments, all of the layers such as the insulating layer 13 and the transparent electrode 15B do not have to be provided. On the contrary, the other layers may be further provided. Although the invention can be applied also to the case where the semi-transparent electrode 15A is not provided, as described also in the foregoing embodiments, it is more preferable to provide the resonator having the resonance part constructed by the semi-transparent electrode 15A and the anode 12 for the reason that the reflectivity of external light in the organic EL devices 10R, 10G, and 10B can be suppressed and the contrast can be further improved.

Further, although the first electrode is set as an anode, and the second electrode is set as a cathode in the foregoing embodiments, the first electrode may be set as a cathode and the second electrode may be set as an anode. In this case, light is emitted from the anode side, and the anode takes the form of a semi-transparent electrode or transparent electrode.

In addition, in the foregoing embodiments, by changing the materials of the organic layer 14, red, green, and blue light is emitted. The invention can be also applied to a display for generating the light by combining color changing mediums (CCM) or combining color filters.

In the display and the method of manufacturing the display according to the invention, the red, green, and blue filters are formed by printing and at least two filters out of the red, green, and blue filters are overlapped with each other by printing, thereby forming the black matrix so as to face the boundary region of the organic EL devices. Therefore, by the simple manufacturing process, the color filters and the black matrix having performance necessary and sufficient for the organic EL display can be formed at low cost.

In the display according to an aspect of the invention, the antireflection film is provided on the substrate for sealing. Thus, the surface reflectance of external light in the substrate for sealing can be reduced, and contrast can be further improved.

In the display according to another aspect of the invention, the resonance portion of the resonator is constructed by the semi-transparent electrode and the first electrode. Consequently, multiple interference of light generated in the luminescent layer is caused to make the resonance portion act as a kind of a narrow-band filter, thereby enabling the half band width of the spectrum of light to be emitted decreases and enabling color purity to be improved. In addition, external light entered from the sealing panel can be attenuated by the multiple interference, and the reflectance of the external light in the organic EL device can be reduced to be extremely low by the combination with the color filters. Thus, contrast can be further improved.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a display, comprising the steps of:

forming a driving panel having a substrate, and a plurality of organic EL devices formed over the substrate, each device comprising a first electrode, one or more organic layers including a luminescent layer, and a second electrode, wherein light generated in the luminescent layer is emitted out of the side of the second electrode;

wherein each of the plurality of organic EL devices emits light of either a red, green or blue color, forming a sealing panel by forming a plurality of red, adjacent green and blue filters in stripes with a plurality of projecting portions formed at pre-determined intervals, and a black matrix which is obtained by overlapping at least two adjacent filters out of the red filter, the green filter, and the blue filter on a substrate at least at the projecting portions;

forming an adhesive layer so as to cover the organic EL devices; and disposing the sealing panel so as to seal the space between the organic EL devices and the sealing panel with the adhesive layer, and curing the adhesive layer, thereby adhering the sealing panel and the driving panel to each other, wherein each of the plurality of red, green and blue filters are located over an organic EL device of the same color.

2. A method of manufacturing a display according to claim 1, wherein the red, green, and blue filters and the black matrix are provided on the side of the sealing panel facing the driving panel.

3. A method of manufacturing a display according to claim 1, wherein the black matrix is formed by overlapping two colors which are complementary colors to each other out of the red, green, and blue filters.

4. A method of manufacturing a display according to claim 1, wherein the sealing panel has an antireflection film on the side opposite to the driving panel of the substrate for sealing.

5. A method of manufacturing a display according to claim 1, wherein the color filters are overlapped such that each organic EL device in a row has an adjacent square region wherein each of the three color filters overlap.

6. A method of manufacturing a display according to claim 1, wherein horizontally adjacent filter stripes are formed so as to overlap such that the overlapping portions comprise a vertical portion of the black matrix, and wherein the projecting portions extending from each filter stripe in a horizontal direction are formed such that they further overlap an adjacent filter stripe so as to comprise a horizontal portion of the black matrix.

7. A method of manufacturing a display, comprising the steps of:
   forming a driving panel having a substrate, and a plurality of organic EL devices formed over the substrate, each device comprising a first electrode, one or more organic layers including a luminescent layer, and a second electrode, wherein light generated in the luminescent layer is emitted out of the side of the second electrode;
   forming a sealing panel by forming color filters in stripes with a plurality of projecting portions formed at pre-determined intervals, and a black matrix which is obtained by overlapping at least two adjacent filters out of the red filter, the green filter, and the blue filter on a substrate at least at the projecting portions;
   forming an adhesive layer so as to cover the organic EL devices; and
   disposing the sealing panel so as to seal the space between the organic EL devices and the sealing panel with the adhesive layer, and curing the adhesive layer, thereby adhering the sealing panel and the driving panel to each other.

8. A method of manufacturing a display according to claim 7, wherein horizontally adjacent filter stripes are formed so as to overlap such that the overlapping portions comprise a vertical portion of the black matrix, and wherein the projecting portions extending from each filter stripe in a horizontal direction are formed such that they further overlap an adjacent filter stripe so as to comprise a horizontal portion of the black matrix.

9. A method of manufacturing a display, comprising the steps of:
   forming a driving panel having a substrate, and a plurality of organic EL devices formed over each substrate, each device comprising a first electrode, one or more organic layers including a luminescent layer, and a second electrode, wherein light generated in the luminescent layer is emitted out of the side of the second electrode;
   wherein each of the plurality of organic EL devices emits light of either a red, green or blue color,
   forming a sealing panel by forming a plurality of red, adjacent green and blue filters in stripes with one or more projecting portions formed at pre-determined intervals such that the width of the projecting portion is less than the width of the filter stripe, and a black matrix which is obtained by overlapping at least two adjacent filters out of the red filter, the green filter, and the blue filter on a substrate at least at the one or more projecting portions;
   forming an adhesive layer so as to cover the organic EL devices; and
   disposing the sealing panel so as to seal the space between the organic EL devices and the sealing panel with the adhesive layer, and curing the adhesive layer, thereby adhering the sealing panel and the driving panel to each other,
   wherein each of the plurality of red, green and blue filters are located over an organic EL device of the same color.

* * * * *